United States Patent
Parkinson et al.

(10) Patent No.: US 9,491,886 B1
(45) Date of Patent: Nov. 8, 2016

(54) COMPUTE AND NETWORKING FUNCTION CONSOLIDATION

(71) Applicant: ZNYX Networks, Inc., Fremont, CA (US)

(72) Inventors: David S. Parkinson, San Luis Obispo, CA (US); Alan Deikman, Fremont, CA (US); Troy L. Hawkins, San Luis Obispo, CA (US); Peter A. Hawkins, San Luis Obispo, CA (US); Gary S. Felsman, San Luis Obispo, CA (US); Mark Rickert, Templeton, CA (US)

(73) Assignee: ZNYX Networks, Inc., Fremont, CA (US)

( * ) Notice: Subject to any disclaimer, the term of this patent is extended or adjusted under 35 U.S.C. 154(b) by 243 days.

(21) Appl. No.: 14/474,030

(22) Filed: Aug. 29, 2014

(51) Int. Cl.
*H05K 7/14* (2006.01)
*H05K 7/20* (2006.01)

(52) U.S. Cl.
CPC ........ *H05K 7/1492* (2013.01); *H05K 7/20754* (2013.01)

(58) Field of Classification Search
CPC ............ G06F 9/02; G06F 9/06; G06F 11/00; G06F 13/00; H04M 1/00; H04L 5/14; H04L 12/4625; H04L 12/66
USPC ..................... 361/796; 710/301, 316; 712/38, 712/E9.002, E9.003; 714/6.1, 42, 47.1; 370/276, 355; 455/561
See application file for complete search history.

(56) References Cited

U.S. PATENT DOCUMENTS

| | | | | |
|---|---|---|---|---|
| 8,935,567 B1* | 1/2015 | Martin | ...................... | G06F 3/06 714/42 |
| 2008/0052436 A1* | 2/2008 | Sharma | ............... | G06F 13/4063 710/301 |
| 2008/0244150 A1* | 10/2008 | Sharma | ............... | H04L 12/4625 710/316 |
| 2009/0149221 A1* | 6/2009 | Liu | ..................... | H04W 88/085 455/561 |
| 2011/0035571 A1* | 2/2011 | Sharma | ............... | H04L 12/4625 712/38 |
| 2012/0170492 A1* | 7/2012 | Sharma | ............... | G06F 13/4063 370/276 |
| 2012/0177035 A1* | 7/2012 | Sharma | ............... | G06F 13/4063 370/355 |
| 2013/0007414 A1* | 1/2013 | Sharma | ............... | H04L 12/4625 712/38 |

* cited by examiner

*Primary Examiner* — Xiaoliang Chen
(74) *Attorney, Agent, or Firm* — Carr & Ferrell LLP

(57) ABSTRACT

An apparatus for compute and networking operation in a rack-mounted device are provided herein. An exemplary apparatus may include a compute substrate, a networking substrate, and a bridge substrate. The compute substrate may include a processor, and a memory communicatively coupled to the processor. The networking substrate may be separate from the compute substrate and include control processor, and an Ethernet switch communicatively coupled to the control processor. The bridge substrate may be communicatively coupled to the compute substrate and the networking substrate, and include at least two high-speed signal traces, the high-speed signal traces being at least one differential pair, the high-speed signal traces being communicatively coupled to the compute substrate and the networking substrate.

17 Claims, 8 Drawing Sheets

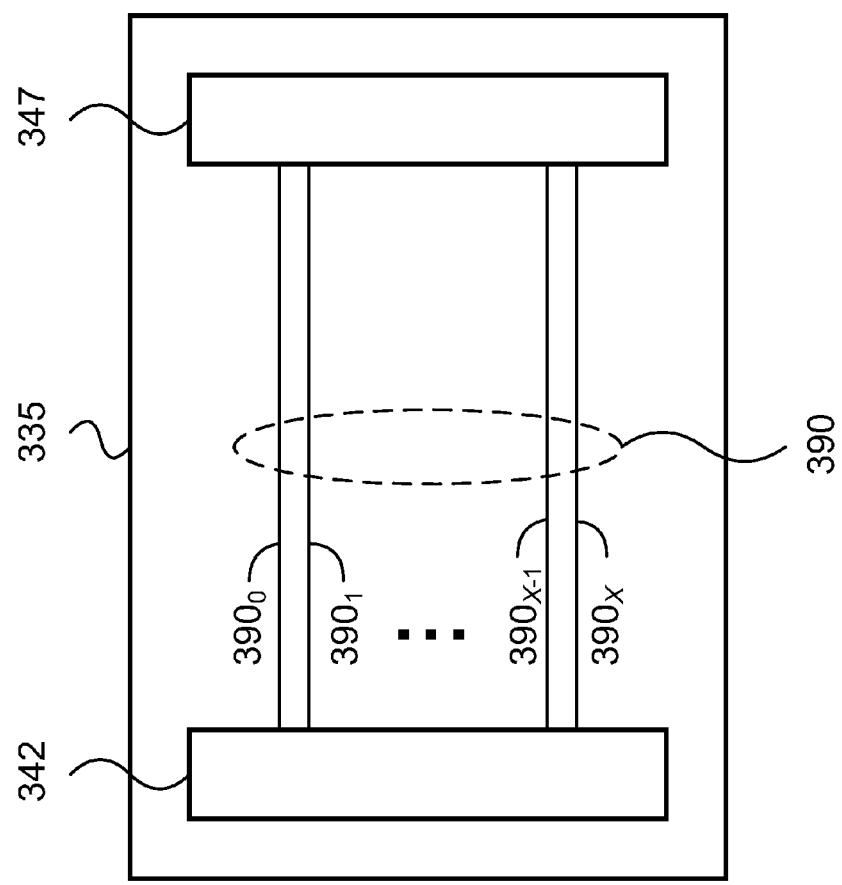

COMPUTE AND NETWORKING FUNCTION CONSOLIDATION

BACKGROUND OF THE INVENTION

1. Field of the Invention

The present technology pertains to communications systems, and more specifically to communications systems including network and compute functions.

2. Description of Related Art

A data center is a facility used to house computer systems and associated components. A data center can occupy one room of a building, one or more floors, or an entire building. Data center equipment is generally mounted in 19 inch rack cabinets, which are usually placed in single rows forming corridors (e.g., aisles) between them. Equipment designed for placement in a rack is typically described as rack mount, a rack-mounted device or system, a rack mount chassis, subrack, rack mountable, and shelf. Rack-mounted equipment includes separate hardware for network and processing functions.

BRIEF SUMMARY OF THE INVENTION

In at least one embodiment, the present technology is directed to an apparatus for compute and networking operations in a rack-mounted device. The apparatus may include a compute substrate, a networking substrate, and a bridge substrate. The compute substrate may include a processor, and a memory communicatively coupled to the processor. The networking substrate may be separate from the compute substrate and include a control processor, and an Ethernet switch communicatively coupled to the control processor. The bridge substrate may be communicatively coupled to the compute substrate and the networking substrate, and include at least two high-speed signal traces, the high-speed signal traces being at least one differential pair, the high-speed signal traces being communicatively coupled to the compute substrate and the networking substrate.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments. The methods and systems disclosed herein have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

FIG. 3D is a simplified block diagram showing a bridge board of FIG. 3B, according to some embodiments.

DETAILED DESCRIPTION

Figure 1:
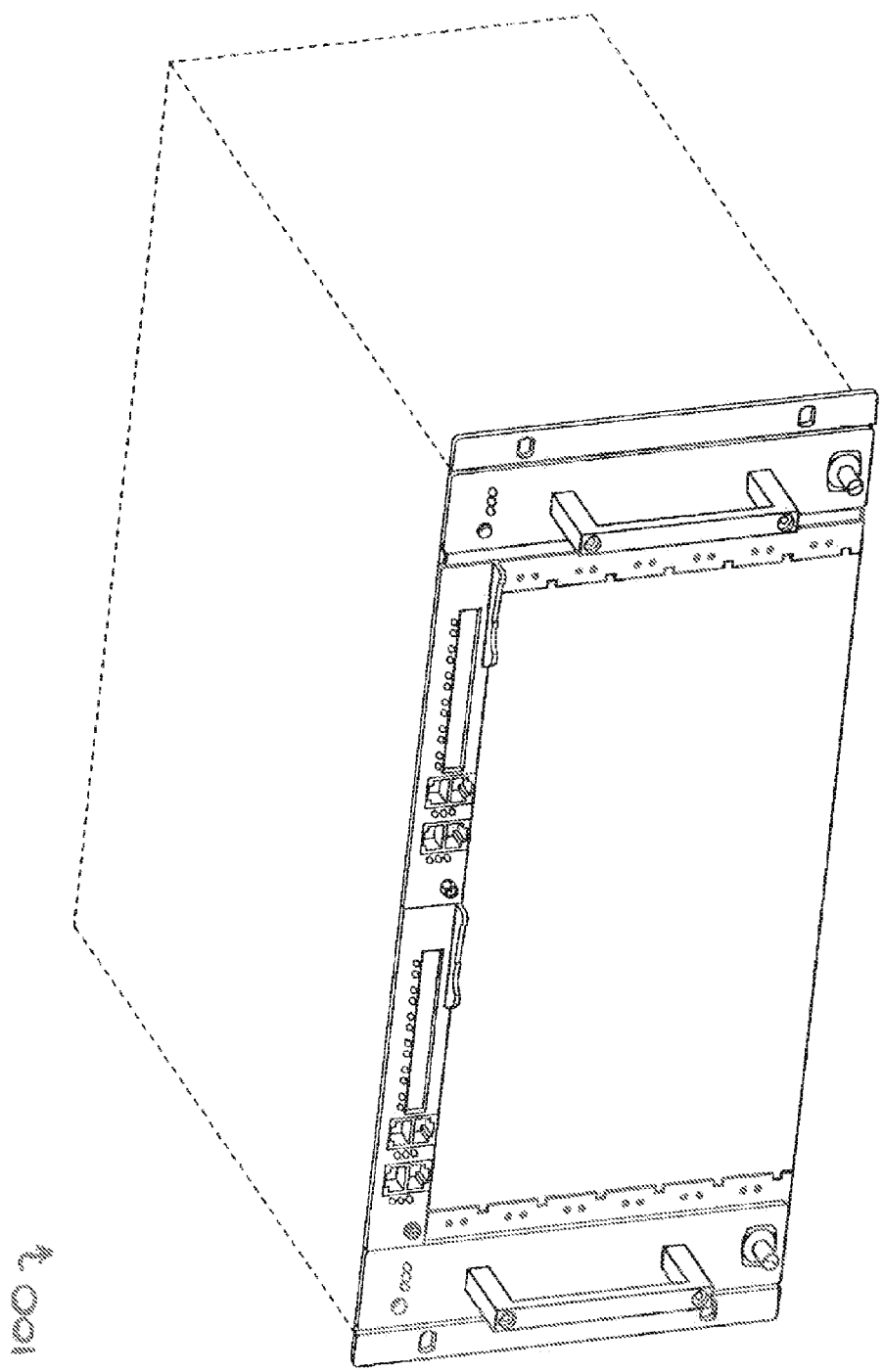
FIG. 1 illustrates a shelf, according to some embodiments of the present invention.

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated. The terminology used herein is for the purpose of describing particular embodiments only and is not intended to be limiting of the technology. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that like or analogous elements and/or components, referred to herein, may be identified throughout the drawings with like reference characters. It will be further understood that several of the figures are merely schematic representations of the present technology. As such, some of the components may have been distorted from their actual scale for pictorial clarity.

According to various embodiments of the present invention, compute and networking functions on separate substrates may be integrated in one rack-mount device. In some embodiments, the rack-mounted device is a blade.

FIG. 1 illustrates a shelf 100. For example, shelf 100 is a 5 rack unit Advanced Telecommunications Computing Architecture (ATCA) shelf. A rack unit (U) is a unit of measure that describes the height of equipment designed to mount in a 19-inch rack and/or 23-inch rack. The 19-inch (482.6 mm) or 23-inch (584.2 mm) dimension refers to the width of the equipment mounting frame in the rack including the frame; the width of the equipment that can be mounted inside the rack is less. One rack unit (1 U) is 1.75 inches (4.445 cm) high.

Shelf 100 may be a modular computing device that includes a rack mountable enclosure that typically has, for example, six ATCA compliant slots that are interconnected electrically via a backplane (not shown in FIG. 1). For example, 5 U ATCA shelves are constructed in accordance with the AdvancedTCA standards. Each of the slots may be adapted to receive a payload/blade and/or a chassis management module. Payloads/blades may provide any of a number of computing functions (e.g., compute and networking functions). A payload/blade (as well as the chassis management modules and hubs) may also be referred to as a field replaceable unit (FRU) and/or a node.

In some embodiments, shelf 100 includes two chassis management modules (not shown in FIG. 1). The two chassis management modules are configured to monitor and control the operation of the individual payloads/blades (not shown in FIG. 1). Each chassis management module may include a printed circuit board having at least one processor and a memory for storing executable instructions. The executable instructions may control the operation of the payload blades, along with other functions of the shelf, such as power management, power monitoring, and temperature monitoring.

Two of the available slots may be used for hub slots. Other slots can be payloads/blades (e.g., compute and networking functions), which may be communicatively coupled with each of two chassis management modules via at least one of two hub blades (e.g., switches).

A backplane of shelf 100 (not shown in FIG. 1) may provide power and electrical coupling between the different payloads/blades of the shelf and two chassis management modules.

As would be readily appreciated by one of ordinary skill in the art, other rack-mounted equipment and configurations may be used. For example, shelf 100 can be 1 U, 2 U, 14 U, etc. In some embodiments, rack-mounted devices are mounted in a 19-inch rack and/or 23-inch rack without shelf 100.

Figure 2A:
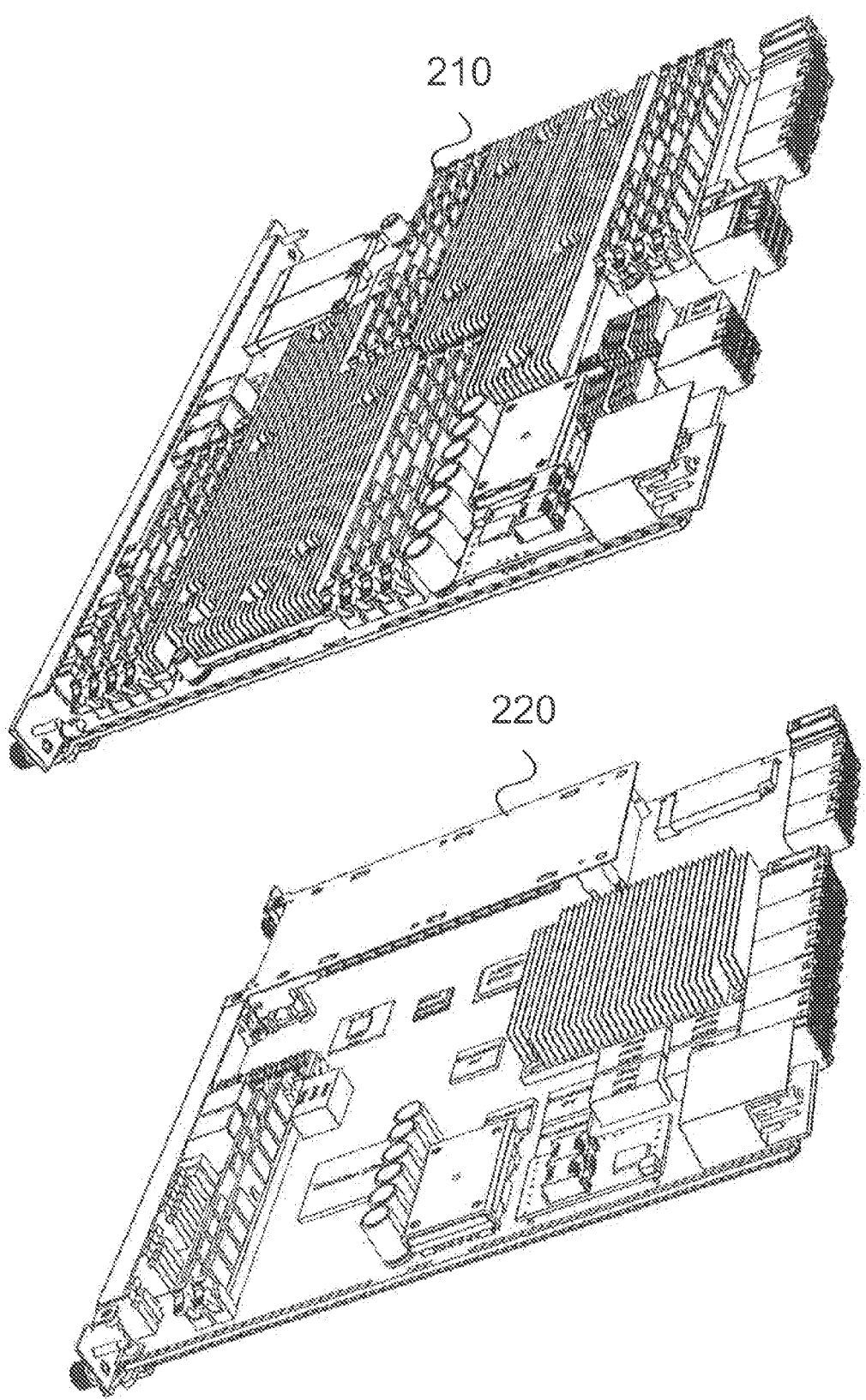
FIG. 2A depicts separate rack-mounted devices for compute and networking functions, according to various embodiments.

FIG. 2A illustrates separate rack-mounted devices 210 and 220 for compute and networking functions, respectively. Separate compute 210 and networking 220 rack-mounted devices consume at least two payload slots in a rack-mount shelf (or rack space in a rack). Separate compute 210 and networking 220 rack-mounted devices may not be suitable in instances where higher levels of integration are needed (e.g., greater functionality is needed from shelf 100 or a rack), because they consume rack and/or shelf space which could otherwise be used by other functions. Also, compute 210 and networking 220 rack-mounted devices each consumes rack and/or shelf infrastructure (e.g., power and cooling).

Moreover, compute 210 and networking 220 rack-mounted devices each incur costs associated with their respective bill of materials (e.g., active components, passive components, electromechanical components, and the like) and enclosure (e.g., (metal) front panel, rear panel, top cover, bottom cover, and the like). Communications between compute 210 and networking 220 rack-mounted devices is accomplished over cables running between compute 210 and networking 220 rack-mounted devices, the cables having standards-compliant connectors. Such communications suffers from lower bandwidth (e.g., than communications within a single substrate). Also, standards-compliant connectors may be more expensive and require more physical space than other connectors. Separate compute 210 and networking 220 rack-mounted devices consume more rack space, cost more, and offers lower performance than consolidated approaches, which will be described further below in relation to FIGS. 2B and 3A.

Figure 2B:
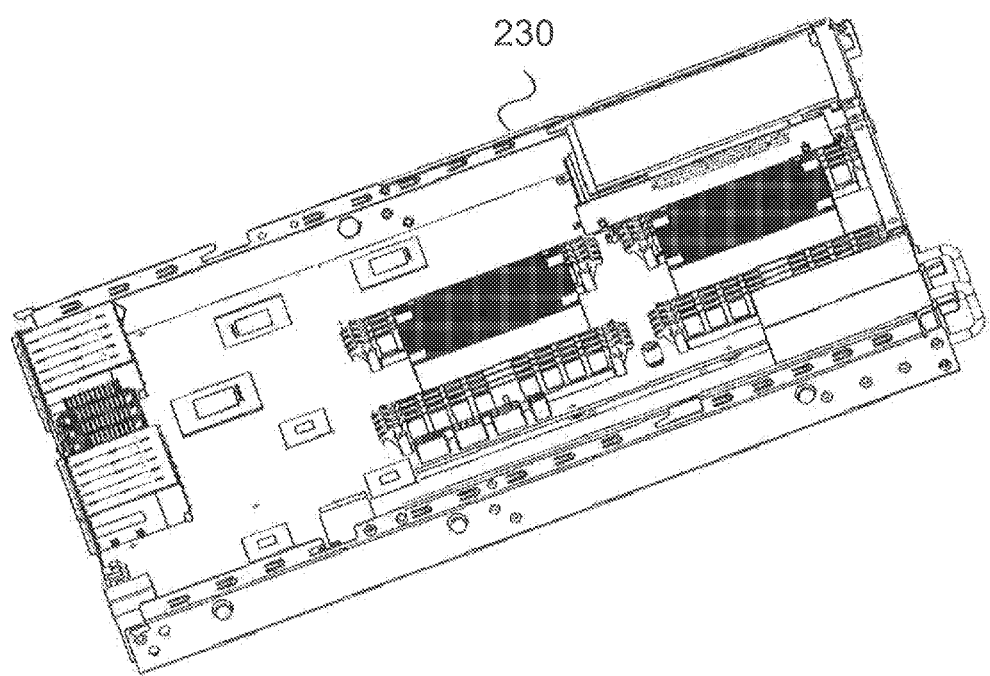
FIG. 2B shows a single substrate integrating compute and networking functions, according to assorted embodiments.

FIG. 2B depicts single substrate 230 including compute and networking resources. Single substrate 230 may be more complicated to develop than separate compute 210 and networking 220 rack-mounted devices (FIG. 2A). Compute functions have different layout requirements than networking functions. For example, the design rules (e.g., trace widths and spacing, number of signal layers and spacing, via widths and spacing, ground plane design, and power plane design) for compute functions and networking functions may be different. In some embodiments, the cost of manufacturing and assembling a separate substrate suitable for compute functions is less expensive than a separate substrate suitable for networking operations. However, when compute and networking functions are integrated onto one substrate, the entire substrate incurs the higher costs associated with the networking portion's design rules, and the one integrated substrate does not benefit from the lower costs associated with the compute portion's design rules.

Installation of substrate 230 in a rack-mounted device suffers from heat dissipation challenges. The combination of compute and networking functions generally generates more heat than the either of compute rack-mounted device 210 and networking rack-mounted device 220 (FIG. 2A) individually, so thermal management is essential. Cooling fans are generally placed at the either the front panel or back panel, since the interior of the rack-mounted device enclosure is substantially consumed by single substrate 230. However, the number of user inputs and/or outputs, and input/output (I/O) ports (e.g., connectors) offered by substrate 230 is greater than on either of compute rack-mounted device 210 and networking rack-mounted device 220 individually, because substrate 230 integrates both compute and networking functions.

Accordingly, the number of user inputs and/or outputs, and input/output (I/O) ports (e.g., connectors) at each of the front and rear panels of the rack-mounted device housing substrate 230, may make placement of cooling fans at the front and rear panels impractical. In addition, even if fans could be placed at either the front panel or the rear panel, a thermal gradient may result, where one end is hotter than the other end, providing inadequate cooling to some sections.

Moreover during the course of design and development of substrate 230, an engineering change may be needed to only one (e.g., compute or networking) portion of the substrate, but the change to one portion affects the other portion. For example, the substrate may need to undergo layout again and a new substrate manufactured and assembled. Re-layout may be complicated by signal integrity constraints. Although only one portion requires the engineering change, the entire board may undergo layout again and the cost of producing another whole substrate (including both compute and networking portions) incurred. Hence, design and development of an integrated substrate may cost more and take longer than for the separate rack-mounted devices illustrated in FIG. 2A.

Figure 3A:
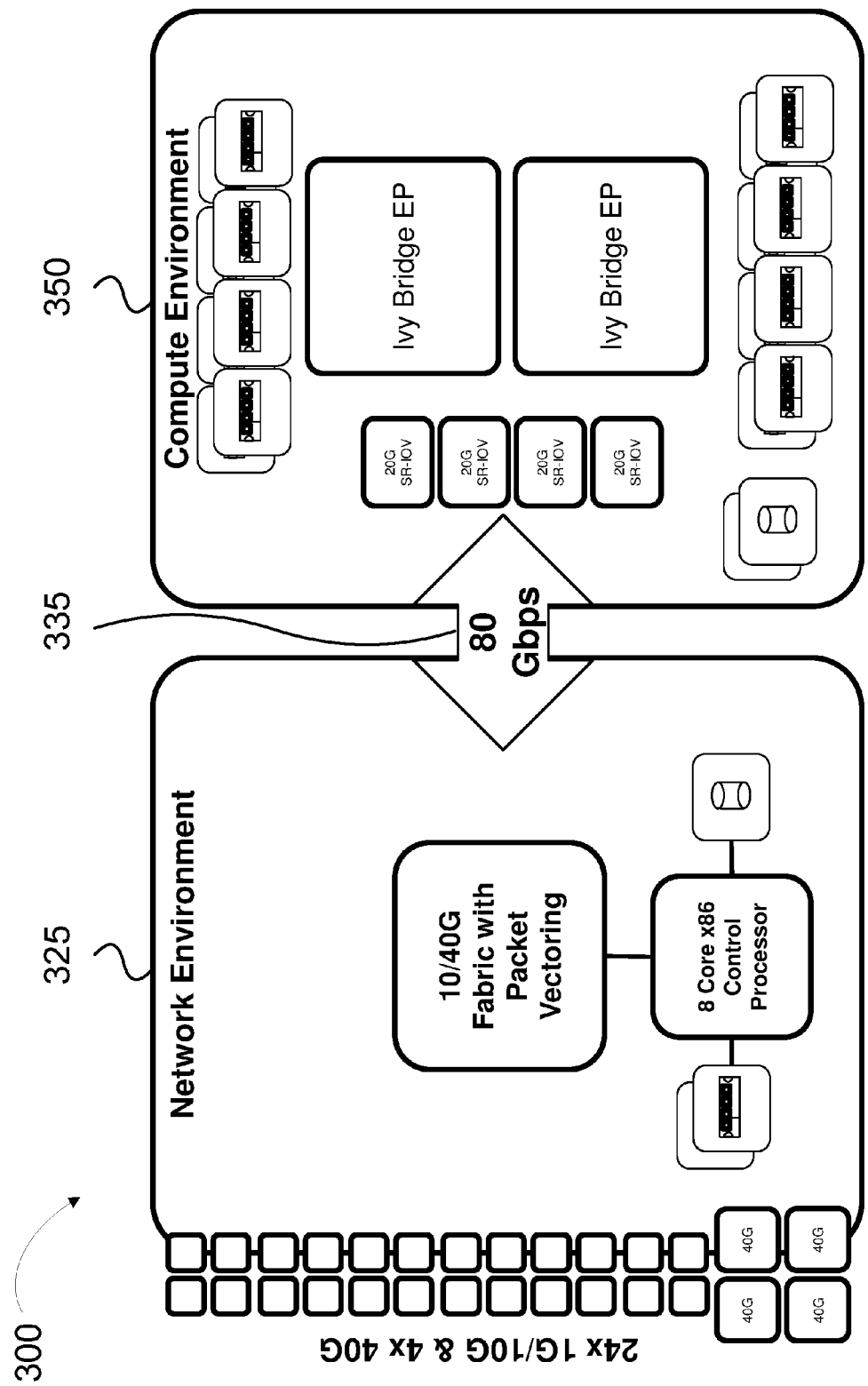
FIG. 3A is a simplified block diagram of a rack-mounted device including compute and networking functions.

FIG. 3A is a simplified block diagram of single rack-mounted device 300, including networking substrate 325, bridge substrate 335, and compute substrate 350. Single rack-mounted device 300 is described further in relation to FIGS. 3B-D.

Figure 3B:
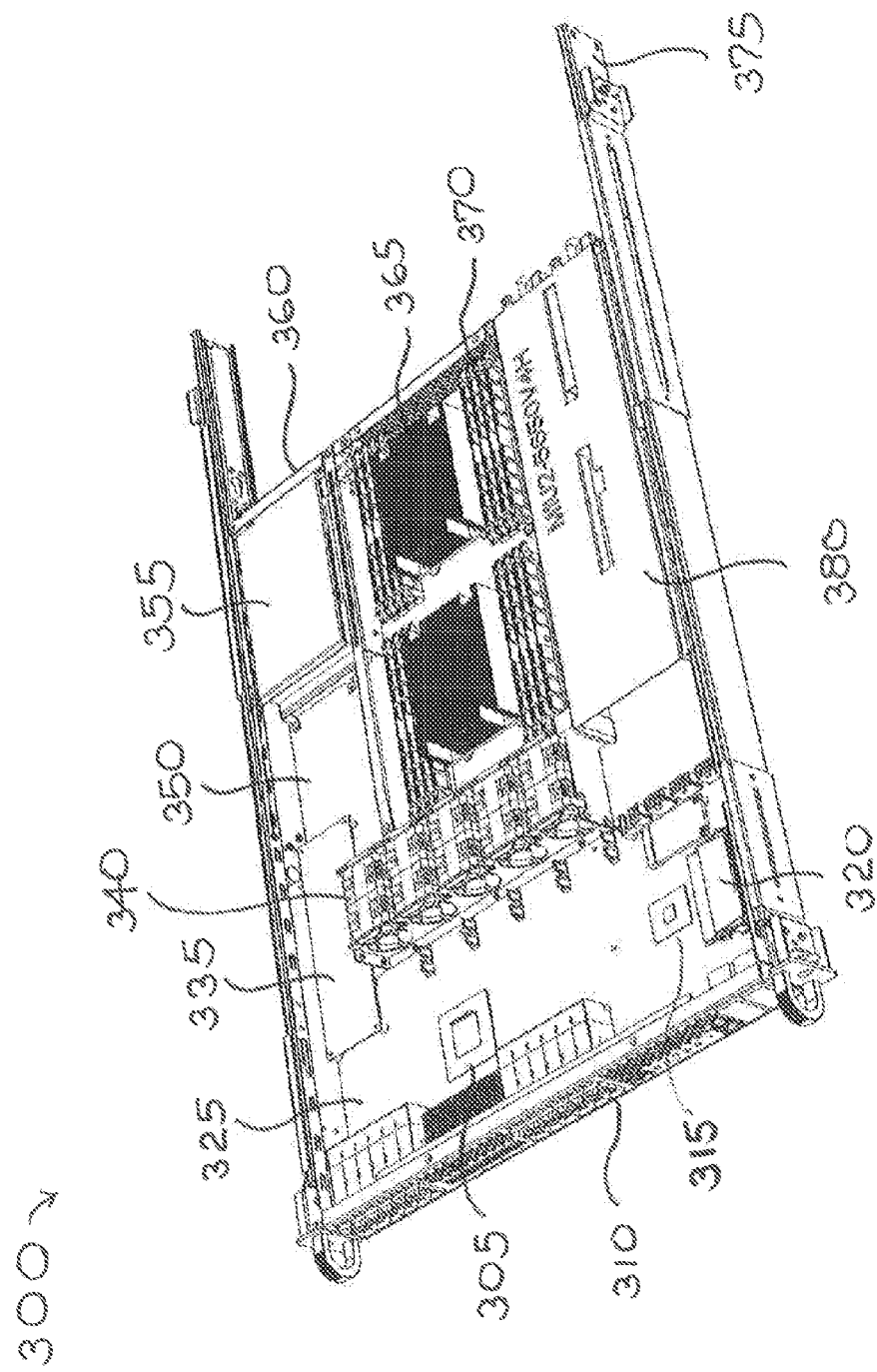
FIG. 3B is a simplified block diagram illustrating compute and networking substrates consolidated into a single rack-mounted device, in accordance with some embodiments.

FIG. 3B depicts a single rack-mounted device 300 including networking substrate 325, bridge substrate 335, and compute substrate 350 according to some embodiments. In some embodiments, rack-mounted device 300 is an AdvancedTCA board (blade), which is 280 mm deep and 322 mm high. In various embodiments, rack-mounted device 300 is configured for mounting in a 19-inch and/or 23-inch rack. Rack-mounted device 300 may also include (metal) front panel 310, (metal) rear panel 360, fan 340, power supply 380, a metal cover (not shown in FIG. 3) on the bottom of the printed circuit board to limit electromagnetic interference and/or to limit the spread of fire, and rail slides 375. In some embodiments, rack-mounted device 300 is 1 U, although other sizes (e.g., 2U, 3U, etc.) may be used.

Front panel 310 may be communicatively coupled to at least one of networking substrate 325 and compute substrate 350. For example, front panel 310 may include user input (e.g., reset button) and user outputs (e.g., light emitting diodes (LEDs), liquid crystal display (LCD) display, touch screen, etc.). In some embodiments, user outputs are one or more of out of service, healthy, power supply fault, and fan fault indicators. Front panel 310 may also include one or more input/output (I/O) ports (e.g., connectors). For example, I/O ports include one or more of an enhanced small form-factor pluggable (SFP+) connector, quad (4-channel) small form-factor pluggable (QSFP+) connector, universal serial bus (USB) connector (e.g., for network and/or compute consoles), and the like. As would be readily appreciated by one of ordinary skill in the art, other combinations and permutations of user inputs, user outputs, and I/O ports may be used.

Rear panel 360 may be communicatively coupled to at least one of networking substrate 325 and compute substrate 350. For example, rear panel 360 may include user input/control (e.g., power button) and user outputs (e.g., light emitting diodes (LEDs), LCD display, touch screen, etc.). In some embodiments, user outputs are one or more of out of power supply faults, fan faults, general fault notification, healthy, and out of service indicators. Rear panel 360 may include connectors for receiving power for power supply 380, for example, using two- or three-conductor power cords. Rear panel 360 may also include at least one of one or more input/output (I/O) ports (e.g., connectors) and a grating (e.g., opening covered with bars, a lattice, and the like to allow for air flow in and/or out of rack-mounted device 300). As would be readily appreciated by one of ordinary skill in the art, other combinations and permutations of user inputs, user outputs, I/O ports, and gratings may be used.

Fan 340 is disposed within rack-mounted device 300 and may be one or more fans for active cooling of rack-mounted device 300. For example, fan 340 performs at least one of drawing cooler air into rack-mounted device 300 from outside of rack-mounted device 300, expelling warm air from inside rack-mounted device 300, and moving air across a heat sink to cool a particular component (e.g., heat sink on processor 365). Fan 340 may be one or more of axial flow fan, centrifugal fan, and cross flow fan. Fan 340 may also be one or more of a square frame and round frame fans having a height or diameter (respectively) of 40 mm, 60 mm, 80 mm, 92 mm, 120 mm, and 140 mm, depending upon the height of rack-mounted device 300. Fan 340 may spin at a maximum rate in rotations per minute (RPM). In some embodiments, fan 340 is five axial flow 40 mm square frame fans spinning at a maximum rate of 25,000 RPM and disposed adjacent to each other (e.g., as depicted in FIG. 3B). Fan 340 may be coupled to rack-mounted device 300 using a bracket (not shown in FIG. 3B).

Rack-mounted device 300 may be installed in a shelf or rack using a pair of rails mounted directly onto the shelf or rack and rack slides 375 on either side of rack-mounted device 300, such that rack-mounted device 300 slides into the rack along the rails, which support it. When in place, rack-mounted device 300 may also then be bolted to the shelf or rack. The rails may also be able to fully support rack-mounted device 300 when it has been slid clear of the rack, such that rack-mounted device 300 may be inspected or serviced and then slid back into the shelf or rack. Rack slides 375 optionally include a tilt mechanism allowing easy access to the top or bottom of rack mounted equipment when it is fully extended from the rack.

Compute substrate 350, bridge substrate 335, and networking substrate 325 may each be printed circuit boards (PCBs) having different physical characteristics (e.g., number of layers and layer thicknesses). PCBs mechanically support and electrically connect (surface-mounted) electronic components using conductive tracks, pads, and other features etched from copper sheets laminated onto a non-conductive substrate. PCBs are multi-layer. Conductors on different layers are connected using plated-through holes called vias. PCBs may include components—capacitors, resistors or active devices—embedded in the substrate. By way of example and not limitation, PCB non-conductive substrates maybe one or more of Isola FR408HR, Nelco N4000-13, Panasonic Megtron-6, Rogers RO3003/RO4350, and the like.

Compute substrate 350 includes processor 365, memory 370, and non-volatile storage 355. Processor 365 may be one or more processors. Memory 370 may be one or more banks of dynamic random access memory (DRAM). Non-volatile storage 355 may be one or more (solid-state drive (SSD) or rotating magnetic) disk drives. By way of non-limiting example, processor 365 is dual Intel® XEON® class processors, memory 370 is up to 1 terabyte (TB) of DDR3 DRAM, and non-volatile storage 355 is dual 2.5 inch SSD disk drives. Embodiments of processor 365, memory 370, and non-volatile storage 355 are described further in relation to FIG. 4.

Compute substrate 350 includes applications stored in memory 370 and non-volatile storage 355 to offer services such as virtualization (e.g., virtual machine hosting), security monitoring, and the like.

Compute substrate 350 includes a high-speed Ethernet module (not shown in FIG. 3B), for communications with networking substrate 325. For example, the Ethernet module includes one or more serializer/deserializers (SerDes) transmitting Ethernet frames at rates of 10-100 gigabits per second (10 to 100 Gbit/s). Protocol/interfaces for the high-speed Ethernet port include: 1000BASE-X, 10GBASE-KX4, 10GBASE-KR, 40GBASE-KR4, 100GBASE-KR10, 100GBASE-KR4, XLAUI, CAUI, SFI, and the like. As would be readily appreciated by one of ordinary skill in the art, other configurations of high-speed Ethernet may be used, as well as other high-speed communication protocols, such as PCI Express, RapidIO, Infiniband and the like.

In some embodiments, Ethernet module includes one or more Intel® 82599 10 Gigabit Ethernet Controllers. For example, four Intel® 82599 10 Gigabit Ethernet Controllers (e.g., configured for 10GBASE-KR). In various embodiments, Ethernet switch includes one or more Intel® Ethernet Controller XL710 (e.g., XL710-AM1 and/or XL710-AM2). By way of further non-limiting example, two Intel® Ethernet Controller XL710s.

In some embodiments, the high-speed Ethernet module includes eight 10 G Ethernet ports (XAUI) each using a 10.125 Gbit/s low-voltage differential signaling or LVDS (TIA/EIA-644) pair. In further embodiments, the high-speed Ethernet module includes four Rapid I/O 20 G ports each using four 6.25 Gbit/s LVDS pairs. In additional embodiments, the high-speed Ethernet port includes two 40 G Ethernet ports (XLAUI) each using four 10.3125 Gbit/s LVDS pairs.

Networking substrate 325 includes Ethernet switch 305, control processor 315, and memory 320. For example, Ethernet switch 305 is a non-blocking Ethernet switch communicatively coupled to connectors (e.g., QSFP, SFP+, etc.) on front panel 310. In some embodiments, Ethernet switch 305 offers four 40 G QSFP ports and/or 24 10 G SFP+ ports. By way of example and not limitation, Ethernet switch 305 is a Broadcom® Trident series Ethernet switch, control processor 315 is an Intel® Atom™ processor, and memory 320 may be up to 16 GB of DDR3 DRAM.

Figure 4:
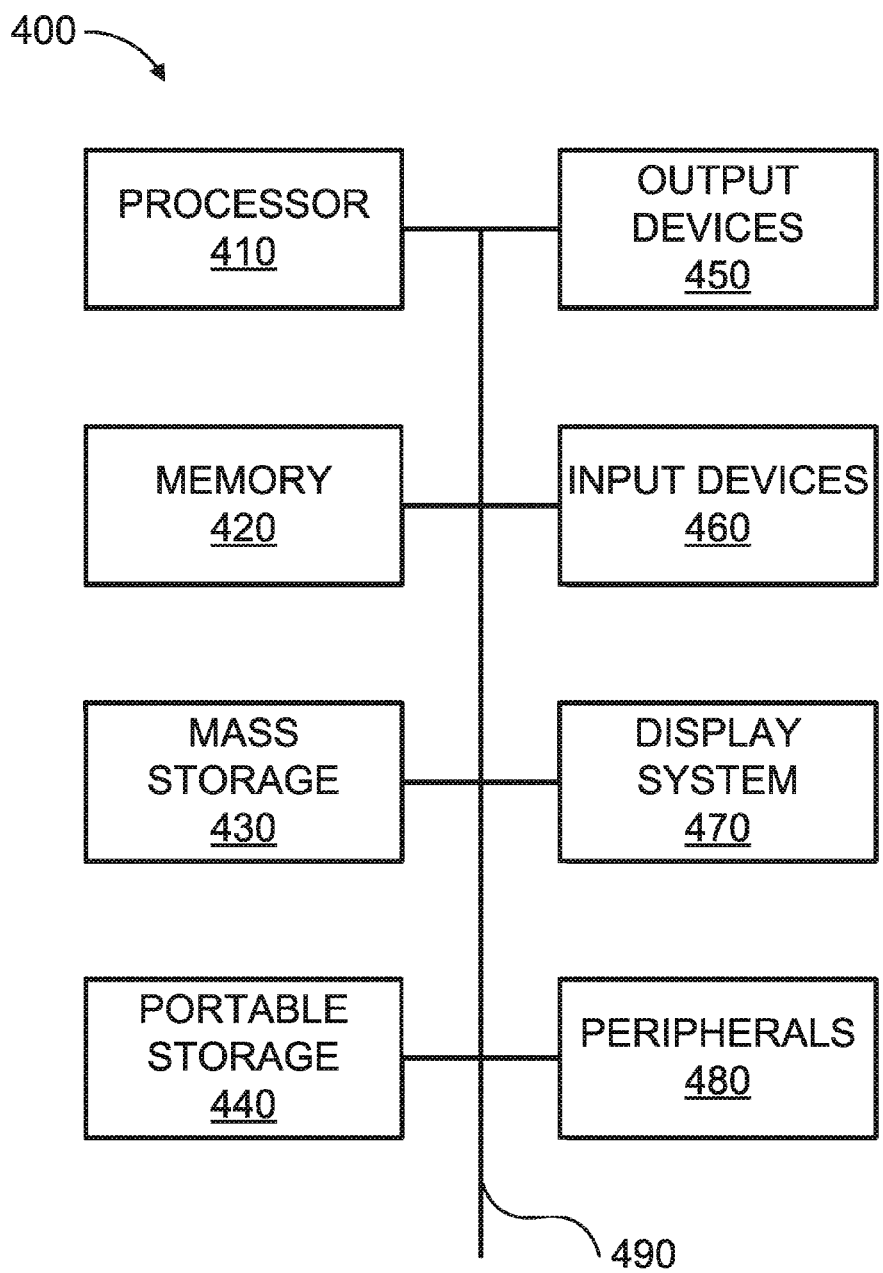
FIG. 4 is a simplified block diagram for a computing system according to some embodiments.

Embodiments of control processor 315 and memory 320 are described further in relation to FIG. 4.

Networking substrate 325 includes a high-speed Ethernet module, such as in Ethernet switch 305. The high-speed Ethernet module includes one or more SerDes for communications with compute substrate 350. Generally, a configuration of the high-speed Ethernet module of networking substrate 325 is substantially compatible with the configuration of the high-speed Ethernet module of compute substrate 350 for interoperability.

Networking substrate 325 is configured to perform operations, such as switching, packet processing (e.g., Ethernet packet vectoring), and the like.

Bridge substrate 335 communicatively couples the high-speed Ethernet module of networking substrate 325 and the high-speed Ethernet module of compute substrate 350. Bridge substrate 335 may be configured for high-speed Ethernet signals. By way of non-limiting example, the non-conducting (or dielectric) layers (not shown in FIG. 3B) of bridge substrate 335 are comprised of at least one of Isola FR408HR, Nelco N4000-13, Panasonic Megtron-6, Rogers RO3003/RO4350.

Figure 3C:
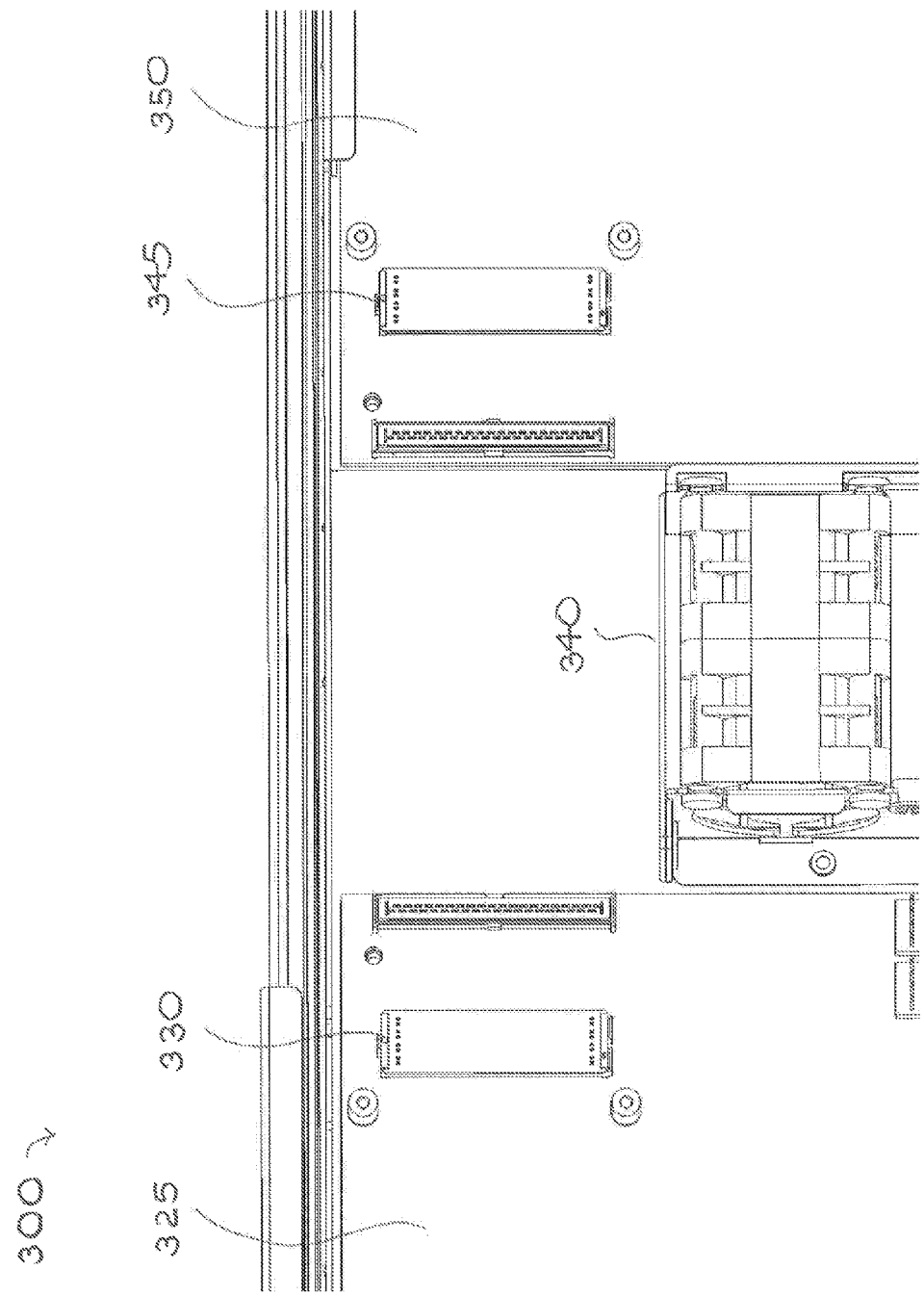
FIG. 3C is a simplified block diagram depicting further details of the compute and networking features of FIG. 3B, in accordance with various embodiments.

FIG. 3C illustrates additional details of rack-mounted device 300. Compute substrate 350 includes connector 345 for coupling to respective connector 347 on bridge substrate 335 depicted in FIG. 3D. Generally, the gender of connector 345 will be the opposite of respective connector 347 on bridge substrate 335 (e.g., when connector 345 is "male," respective connector 347 is "female," and vice-versa). Networking substrate 325 includes connector 330 for coupling to respective connector 342 on bridge substrate 355 depicted in FIG. 3D. Generally, the gender of connector 330 will be the opposite of respective connector 342 on bridge substrate 335 (e.g., when connector 330 is "male," the respective connector 342 is "female," and vice-versa).

The design, materials, and characteristics of connectors 330, 342, 345, and 347 are selected for high-speed differential signaling between compute substrate 350 and networking substrate 325 through bridge substrate 335. For example, the amount of loss introduced by traces on compute substrate 350, networking substrate 325, bridge substrate 335, and connectors 330, 342, 345, and 347 along a high speed signal path must remain within an interconnect budget. The interconnect budget may include an amount of loss and jitter allowed in the interconnect and still meet a target specification. Loss is differential voltage attenuation from transmitter to receiver on a trace. The trace is subject to resistive, dielectric, and skin effect loss. Jitter is the variation in time between differential crossings from the ideal crossing time. The target specification is generally provided in the timing and electrical specifications for the particular high-speed signaling interface used (e.g., 10GBASE-KR, 40GBASE-KR4, XLAU/CLAUI, RapidIO, PCI Express, and the like).

By way of non-limiting example, connectors 330, 342, 345, and 347 are at least one of Samtec SE Array™ SEAM/SEAF Series connectors (having respective genders as described above). In some embodiments, connectors 330 and 345 are SEAF-30-05.0-S-08-2-A-K-TR and connectors 342 and 347 are SEAM-30-03.0-S-08-2-A-K-TR.

FIG. 3D shows additional features of bridge substrate 335. Bridge substrate 335 includes high-speed signal traces 390 which, for example, are at least one of stripline and microstrip. High-speed signal traces may be routed as closely coupled differential pairs (e.g., $390_0$ and $390_1$ to $390_{x-1}$ and $390_x$). In some embodiments, data is transmitted over high-speed signal traces 390 using low-voltage differential signaling (LVDS). In a differential pair (e.g., $390_0$ and $390_1$, and $390_{x-1}$ and $390_x$), one of the signal paths (traces) is "negative" and the other "positive." In various embodiments, data transmitted over high-speed signal traces 390 is encoded (e.g., using 8b/10b, 64b/66b, and other line code). At least some of high-speed signal traces 390 have a nominal differential impedance of 100Ω±10% with approximately 7% coupling (e.g., the common mode impedance is approximately 28.8Ω for a differential impedance of 100Ω).

Optionally, at least some of high-speed signal traces 390 are referenced to a ground plane (not shown in FIG. 3D) for controlled characteristic impedance, the ground plane being at least one of solid/continuous and used along the entire length of the trace path. Optionally, inter-pair spacing may be maximized to reduce crosstalk (e.g., 4× trace width spacing). Optionally, blind and/or back-drilled vias (not shown in FIG. 3D) are used to remove stub vias. The number of vias in a high-speed path of high-speed signal traces 390 may be minimized, where within a differential pair (e.g., $390_0$ and $390_1$, and $390_{x-1}$ and $390_x$), there are the same number of vias on the positive and negative signal traces and the vias are placed symmetrically on the positive and negative signal traces. Optionally stitching vias are used for signal layer transitions.

The architecture of rack-mounted device 300 described above offers numerous advantages. For example, compute substrate 350 and networking substrate 325 are separate substrates. Each of compute substrate 350 and networking substrate 325 can be separately designed, manufactured, and assembled according to their respective design rules without one affecting (e.g., requiring changes to or compromises from) the other and such that the generally lower costs of compute substrate 350 are realized. A stackup of networking substrate 325 may be more expensive than a stackup of compute substrate 350, because networking substrate 325 includes a greater number of critical routes with tighter signal integrity constraints. Although compute substrate 350 includes high-speed routes, the number of high-speed routes is fewer than in networking substrate 325 and the critical routes of compute substrate 350 may be isolated, such that the overall stackup of compute substrate 350 is not penalized. In addition, engineering changes may be independently made to compute substrate 350 or networking substrate 325, without affecting (e.g., requiring changes to or compromises from) networking substrate 325 or compute substrate, respectively. Such engineering changes to one of compute substrate 350 or networking substrate 325 are easier than when these functions are implemented in a single substrate, because of signal integrity constraints encountered in the single substrate. Cost savings result from such engineering changes, because only one of a new compute substrate 350 or networking substrate 325 would be manufactured and assembled, instead of both.

Further cost savings are attained, because standards-compliant connectors are not required for communications between compute and networking functions, such as when they are in different rack-mounted devices (FIG. 2A). In addition, architecture of rack-mounted device 300 has thermal management advantages. For example, fan 340 may be disposed between compute substrate 350 or networking substrate 325 in rack-mounted device 300, such that fan 340 does not consume precious space on front panel 310 and rear panel 360, and cooling from fan 340 is more evenly distributed within rack-mounted device 300 (e.g., the temperature difference between front panel 310 and rear panel 360 is reduced).

Moreover, configuration changes to compute substrate 350 and/or networking substrate 325 may be accomplished with a change to a software configuration. For example, two 40 G 10GBASE-KR links may be used instead of eight 10 G 10GBASE-KR links with only a change to the software configuration. Additionally, different Ethernet modules may be used in one of compute substrate 350 and/or networking substrate 325 and any connection differences accommodated in bridge substrate 335.

FIG. 4 illustrates an exemplary computer system 400 that may be used to implement some embodiments of the present invention. The computer system 400 of FIG. 4 may be implemented in the contexts of the likes of computing systems, networks, servers, or combinations thereof. The computer system 400 of FIG. 4 includes one or more processor units 410 and main memory 420. Main memory 420 stores, in part, instructions and data for execution by processor units 410. Main memory 420 stores the executable code when in operation, in this example. The computer system 400 of FIG. 4 further includes a mass data storage 430, portable storage device 440, output devices 450, user input devices 460, a graphics display system 470, and peripheral devices 480.

The components shown in FIG. 4 are depicted as being connected via a single bus 490. The components may be connected through one or more data transport means. Processor unit 410 and main memory 420 is connected via a local microprocessor bus, and the mass data storage 430, peripheral device(s) 480, portable storage device 440, and graphics display system 470 are connected via one or more input/output (I/O) buses.

Mass data storage 430, which can be implemented with a magnetic disk drive, solid state drive, or an optical disk drive, is a non-volatile storage device for storing data and instructions for use by processor unit 410. Mass data storage 430 stores the system software for implementing embodiments of the present disclosure for purposes of loading that software into main memory 420.

Portable storage device 440 operates in conjunction with a portable non-volatile storage medium, such as a flash drive, floppy disk, compact disk, digital video disc, or Universal Serial Bus (USB) storage device, to input and output data and code to and from the computer system 400 of FIG. 4. The system software for implementing embodiments of the present disclosure is stored on such a portable medium and input to the computer system 400 via the portable storage device 440.

User input devices 460 can provide a portion of a user interface. User input devices 460 may include one or more microphones, an alphanumeric keypad, such as a keyboard, for inputting alphanumeric and other information, or a pointing device, such as a mouse, a trackball, stylus, or cursor direction keys. User input devices 460 can also include a touchscreen. Additionally, the computer system 400 as shown in FIG. 4 includes output devices 450. Suitable output devices 450 include speakers, printers, network interfaces, and monitors.

Graphics display system 470 include a liquid crystal display (LCD) or other suitable display device. Graphics display system 470 is configurable to receive textual and graphical information and processes the information for output to the display device.

Peripheral devices 480 may include any type of computer support device to add additional functionality to the computer system.

The components provided in the computer system 400 of FIG. 4 are those typically found in computer systems that may be suitable for use with embodiments of the present disclosure and are intended to represent a broad category of such computer components that are well known in the art. Thus, the computer system 400 of FIG. 4 can be a personal computer (PC), hand held computer system, telephone, mobile computer system, workstation, tablet, phablet, mobile phone, server, minicomputer, mainframe computer, wearable, or any other computer system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, and other suitable operating systems.

The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

While the present technology has been described in connection with a series of preferred embodiment, these descriptions are not intended to limit the scope of the technology to the particular forms set forth herein. It will be further understood that the methods of the technology are not necessarily limited to the discrete steps or the order of the steps described. To the contrary, the present descriptions are intended to cover such alternatives, modifications, and equivalents as may be included within the spirit and scope of the technology as defined by the appended claims and otherwise appreciated by one of ordinary skill in the art.

What is claimed is:

1. An apparatus for compute and networking operations in a rack-mounted device comprising:
    a compute substrate, the compute substrate including:
        a processor, and
        a memory communicatively coupled to the processor;
    a networking substrate, the networking substrate being separate from the compute substrate, the networking substrate including:
        a control processor, and
        an Ethernet switch communicatively coupled to the control processor; and
    a bridge substrate, the bridge substrate communicatively coupled to the compute substrate and the networking substrate, the bridge substrate including:
        at least two high-speed signal traces, the high-speed signal traces being at least one differential pair, the high-speed signal traces being communicatively coupled to the compute substrate and the networking substrate.

2. The apparatus of claim 1 wherein the rack-mounted device is a 1 U rack-mounted device.

3. The apparatus of claim 2 further comprising:
    at least one cooling fan, the at least one cooling fan disposed at least partially adjacent to the compute substrate and the networking substrate.

4. The apparatus of claim 3 wherein the rack-mounted device further includes:
    a power supply electrically coupled to the compute substrate and the networking substrate;

a front panel communicatively coupled to at least one of the networking substrate and the compute substrate; and a rear panel communicatively coupled to at least one of the networking substrate and the compute substrate.

5. The apparatus of claim 4 wherein the compute substrate further includes a first connector;

the networking substrate further includes a second connector; and the bridge substrate further includes a third connector and a fourth connector communicatively coupled to the high-speed signal traces, the third connector communicatively coupled to the first connector, and the fourth connector communicatively coupled to the second connector.

6. The apparatus of claim 5 wherein the bridge substrate comprises at least one of Isola FR408HR, Nelco N4000-13, Panasonic Megtron-6, and Rogers RO3003/RO4350.

7. The apparatus of claim 6 wherein communication between the compute substrate and the networking substrate uses high-speed Ethernet.

8. The apparatus of claim 7 wherein communication between the compute substrate and the networking substrate through the bridge substrate uses eight 10 G Ethernet ports.

9. The apparatus of claim 7 wherein communication between the compute substrate and the networking substrate through the bridge substrate uses two 40 G Ethernet ports.

10. The apparatus of claim 5 wherein communication between the compute substrate and the networking substrate through the bridge substrate uses high-speed differential signals.

11. The apparatus of claim 10 wherein communication between the compute substrate and the networking substrate through the bridge substrate uses 10 Gbps differential signals.

12. The apparatus of claim 10 wherein the high-speed signal traces comprise at least one closely coupled differential pair and are at least one of a stripline and microstrip.

13. The apparatus of claim 12 wherein at least one high-speed path meets a target specification, the high-speed path including signal traces on the compute substrate, the networking substrate, and the bridge substrate, and the first, second, third, and fourth connectors, the target specification associated with a communications specification.

14. The apparatus of claim 13 wherein at least some of the high-speed signal traces have a nominal differential impedance of approximately 100Ω.

15. The apparatus of claim 14 wherein the at least some of the high-speed signal traces are referenced to a ground plane, the ground plane disposed along the entire length of the at least some of the high-speed signal traces.

16. The apparatus of claim 15 wherein the at least some of the high-speed signal traces are disposed on the bridge substrate using 4× trace width spacing.

17. The apparatus of claim 16 wherein the bridge substrate further includes at least one of blind and back-drilled vias.

* * * * *